US008884385B2

(12) United States Patent
Nishikawa et al.

(10) Patent No.: US 8,884,385 B2
(45) Date of Patent: Nov. 11, 2014

(54) PHYSICAL QUANTITY SENSOR WITH SON STRUCTURE, AND MANUFACTURING METHOD THEREOF

(71) Applicant: Fuji Electric Co., Ltd., Kawasaki (JP)

(72) Inventors: Mutsuo Nishikawa, Matsumoto (JP); Kazunori Saito, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 70 days.

(21) Appl. No.: 13/712,062

(22) Filed: Dec. 12, 2012

(65) Prior Publication Data

US 2013/0193531 A1   Aug. 1, 2013

(30) Foreign Application Priority Data

Jan. 27, 2012   (JP) ................. 2012-015141

(51) Int. Cl.
*G01L 9/00* (2006.01)
*H01L 29/84* (2006.01)
*H01L 29/06* (2006.01)
*G01P 15/12* (2006.01)
*G01P 15/08* (2006.01)

(52) U.S. Cl.
CPC .......... *H01L 29/84* (2013.01); *G01P 2015/084* (2013.01); *H01L 29/0649* (2013.01); *G01P 15/123* (2013.01); *Y10S 257/925* (2013.01)
USPC ........... 257/419; 257/415; 257/420; 257/925; 257/E23.013

(58) Field of Classification Search
CPC ... H01L 29/84; H01L 29/0649; G01P 15/123; G01P 2015/084
USPC .................. 257/415, 419, 420, 925
See application file for complete search history.

(56) References Cited

U.S. PATENT DOCUMENTS

| 7,549,344 | B2 * | 6/2009 | Yamamoto et al. ............. 73/754 |
| 2004/0152228 | A1 | 8/2004 | Benzel et al. |
| 2009/0266170 | A1 | 10/2009 | Murashige et al. |
| 2010/0300207 | A1 * | 12/2010 | Ding et al. ....................... 73/721 |
| 2013/0062713 | A1 * | 3/2013 | Sakuragi et al. ............. 257/419 |

FOREIGN PATENT DOCUMENTS

| JP | 63-122925 A | 5/1988 |
| JP | 07-020917 A | 1/1995 |
| JP | 07-280679 A | 10/1995 |
| JP | 2002-530641 A | 9/2002 |
| JP | 2004-531882 A | 10/2004 |
| JP | 3629185 B2 | 12/2004 |
| JP | 2009-264905 A | 11/2009 |

* cited by examiner

*Primary Examiner* — Michelle Mandala
(74) *Attorney, Agent, or Firm* — Rossi, Kimms & McDowell LLP

(57) ABSTRACT

Provided by some aspects of the invention is a relatively low-cost, relatively highly accurate physical quantity sensor, and a manufacturing method thereof, that relaxes thermal stress from an outer peripheral portion of a diaphragm in a silicon-on-nothing ("SON") structure. By providing a stress relaxation region (trench groove) in an outer peripheral portion of a diaphragm in a SON structure, there can be, in some aspects of the invention, a benefit of relaxing the transmission to the diaphragm of thermal stress generated by the difference in linear expansion coefficient between a package and chip, and it is possible to relax the transmission to an electronic circuit disposed in an outer peripheral portion of mechanical stress generated by a measured pressure. As a result of this, it is possible to provide a highly accurate physical quantity sensor.

5 Claims, 11 Drawing Sheets

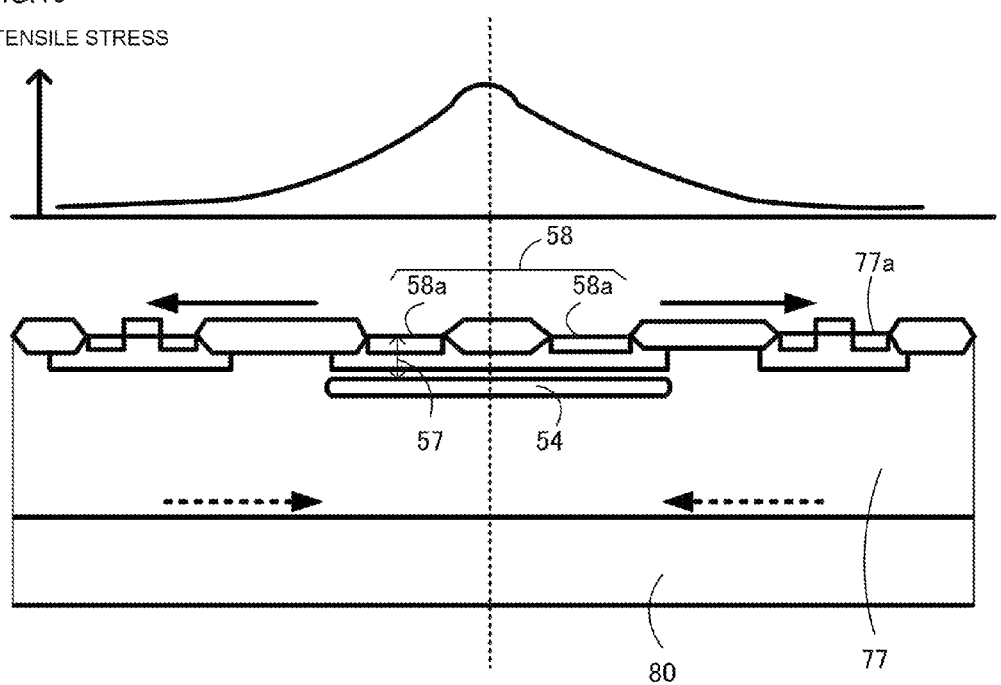

US 8,884,385 B2

PHYSICAL QUANTITY SENSOR WITH SON STRUCTURE, AND MANUFACTURING METHOD THEREOF

BACKGROUND OF THE INVENTION

1. Technical Field

Embodiments of the invention relate to physical quantity sensors having a silicon-on-nothing ("SON") structure, such as pressure sensors or acceleration sensors, and to manufacturing methods thereof.

2. Related Art

FIG. 7 is a schematic view of the whole of a general pressure sensor 600. The pressure sensor 600 includes a package 80, a semiconductor chip 85 fixed in a depressed portion 80a inside the package 80, an external lead-out terminal 81, which is one portion of the package 80, that connects the semiconductor chip 85 and an external circuit (not shown) via a bonding wire 82, and a gel 83 that covers the semiconductor chip 85. Also, the semiconductor chip 85 and package 80 are fixed together with an adhesive 84. Pressure (a measured pressure F) of a fluid, or the like, is applied to the semiconductor chip 85 via the gel 83, and pressure measurement is carried out.

Also, according to JP-T-2002-530641 (the term "JP-T" as used herein means a published Japanese translation of a PCT patent application) and JP-A-63-122925, a groove is formed in the periphery of a diaphragm, thereby controlling the transmission of stress to the diaphragm.

Also, in JP-A-7-20917, a recess is formed in a frame that supports a circular diaphragm 1, and an extraction portion 7 is provided as a depression from the recess to an end portion of the frame. A ring-like sealing groove having a cut in an extraction portion is provided as a depression in the upper surface of the frame in an outer peripheral region of a recess 6. A sealing portion whose upper end surface is higher than the frame is formed of a fluorine system resin, or the like, in the sealing groove and extraction portion. A cover 3 is placed on the upper surface of the frame, and bonded using an anodic bonding method, thereby creating a pressure sensor. A connecting wire provided on the inner surface of the cover is buried in the sealing portion, and the sealing portion and cover are crimped together with no gap. It is described how, by so doing, it is possible to increase the air tightness of the pressure chamber. In this invention, the sealing groove formed in the periphery of the diaphragm is formed in a ring.

Also, in JP-A-7-280679, a thin portion is integrally formed across a thick portion in the periphery of a diaphragm of a sensor element of a semiconductor of silicon, or the like, so as to encircle the diaphragm. A leg portion of the sensor element is formed on an outer side of the thin portion, and the leg portion is bonded to an attachment surface to which the sensor element is attached. It is described how, by so doing, stress from the leg portion concentrates in the thin portion, without being transmitted to the diaphragm, and it is possible to provide a highly accurate pressure sensor.

Also, in Japanese Patent No. 3,629,185, it is described how, by forming a reference pressure chamber at the same time as forming a pressure detecting portion, such as a diaphragm, in a semiconductor substrate surface, using an SON structure, it is possible to realize a semiconductor sensor that can measure with high accuracy, and a manufacturing method thereof, wherein mechanical strength is high, and it is possible to simplify the manufacturing process and reduce the cost.

Also, in JP-T-2004-531882, there is proposed a method of manufacturing a micromachine sensor, and a sensor manufactured using the method, wherein a plurality of apertures are provided in a semiconductor substrate. It is described that a heat treatment is carried out after the apertures are provided in the semiconductor substrate, and because of the heat treatment, a pressure sensor is formed of a SON structure wherein the aperture to a hollow chamber provided in a deep portion of the substrate is caused to shift.

Also, in JP-A-2009-264905, it is described that in a pressure sensor in which a bump is formed, a cavity is formed in a region corresponding to the bump in order to relax stress.

However, in JP-T-2002-530641, JP-A-7-20917, JP-A-63-122925, and JP-A-7-280679, the diaphragm is not formed in an SON structure. Also, in Japanese Patent No. 3,629,185 and JP-T-2004-531882, no stress relaxation region is formed in an outer peripheral portion of the SON structure. Furthermore, in JP-A-2009-264905, mechanical stress from a bump formed on a second SON structure is transmitted to the diaphragm, meaning that the second SON structure functions little as a stress relaxation region.

In JP-T-2002-530641, JP-A-7-20917, JP-A-63-122925, JP-A-7-280679, Japanese Patent No. 3,629,185, JP-T-2004-531882, and JP-A-2009-264905, there is no description of increasing the accuracy of a pressure sensor by forming the diaphragm in an SON structure, and providing a trench groove or SON structure that forms a stress relaxation region in an outer peripheral portion of the diaphragm.

SUMMARY OF THE INVENTION

Embodiments of the invention provide a low-cost, highly accurate physical quantity sensor, and a manufacturing method thereof, with which the heretofore described problems, as well as other problems, are solved by, at least in part, relaxing thermal stress from an outer peripheral portion of a diaphragm in an SON structure.

According to a first aspect of the invention, a physical quantity sensor with SON structure includes a cavity, disposed in a surface layer of a semiconductor substrate and forming a reference pressure chamber, that configures a silicon-on-nothing (SON) structure, a diaphragm, formed from a semiconductor layer, that configures the SON structure above the cavity, a stress relaxation region of the semiconductor substrate disposed distanced from the diaphragm in an outer peripheral portion of the diaphragm, a Wheatstone bridge disposed in the diaphragm, an electronic circuit disposed in an outer peripheral portion of the stress relaxation region, and a connecting wire that connects the Wheatstone bridge and electronic circuit.

According to another aspect of the invention, the physical quantity sensor with SON structure according to another aspect of the invention is such that the stress relaxation region is a trench groove, the plan form of the trench groove is a ring with a place in which one portion is cut, and the connecting wire that connects the Wheatstone bridge and electronic circuit is disposed on the place in which one portion is cut.

According to another aspect of the invention, the physical quantity sensor with SON structure according to another aspect of the invention is such that the stress relaxation region, with the SON structure as a first SON structure, is a second SON structure disposed in an outer peripheral portion of the first SON structure.

According to another aspect of the invention, the physical quantity sensor with SON structure according to another aspect of the invention is such that the plan form of the second SON structure is a ring or a ring with a place in which one portion is cut.

According to another aspect of the invention, the physical quantity sensor with SON structure according to any one of the first to fourth aspects of the invention is such that the physical quantity sensor is a pressure sensor or an acceleration sensor.

According to another aspect of the invention, a method of manufacturing the physical quantity sensor with SON structure according to other aspects of the invention includes a step of forming a trench hole group in a surface layer of a semiconductor wafer, and a trench groove, whose plan form is a ring with a place in which one portion is cut, distanced from the trench hole group in an outer peripheral portion of the trench hole group, a step of performing an annealing, causing trench holes of the trench hole group to deform, thus forming one large cavity configuring an SON structure, and a step of forming a Wheatstone bridge in a semiconductor layer that forms a diaphragm above the cavity, forming an electronic circuit in an outer peripheral portion of the trench groove, and forming a wire that connects the Wheatstone bridge and electronic circuit on the place in the ring in which one portion is cut.

According to another aspect of the invention, it is preferable that the physical quantity sensor with SON structure manufacturing method according to the sixth aspect of the invention is such that the trench hole group and trench groove are formed simultaneously.

According to another aspect of the invention, a method of manufacturing the physical quantity sensor with SON structure according to other aspects of the invention includes a step of forming a first trench hole group in a surface layer of a semiconductor wafer, and a second trench hole group, whose plan form is a ring or a ring with a place in which one portion is cut, distanced from the first trench hole group in an outer peripheral portion of the first trench hole group, a step of performing an annealing, causing first trench holes of the first trench hole group and second trench holes of the second trench hole group to deform, thus forming a first cavity configuring a first SON structure and a second cavity configuring a second SON structure, and a step of forming a Wheatstone bridge in a semiconductor layer that forms a diaphragm above the first cavity, forming an electronic circuit in an outer peripheral portion of the second cavity, and forming a wire that connects the Wheatstone bridge and electronic circuit above the second cavity or across the place in which the second cavity is cut.

According to another aspect of the invention, it is preferable that the physical quantity sensor with SON structure manufacturing method is such that the first trench hole group and second trench hole group are formed simultaneously.

According to embodiments of the invention, by providing a stress relaxation region in an outer peripheral portion of a diaphragm in an SON structure, there is a benefit of relaxing the transmission to the diaphragm of thermal stress generated by the difference in linear expansion coefficient between a package and chip, and it is possible to relax the transmission to an electronic circuit disposed in an outer peripheral portion of mechanical stress generated by a measured pressure F. As a result of this, it is possible to provide a highly accurate physical quantity sensor.

By the stress relaxation region being a trench groove or second SON structure, it can be formed at the same time as an SON structure is formed, and it is thus possible to form a physical quantity sensor at a relatively low cost.

BRIEF DESCRIPTION OF THE DRAWINGS

FIGS. 1A to 1C are configuration diagrams of a pressure sensor, which is an embodiment of the invention, wherein FIG. 1A is a sectional view of a main portion of the completed article, FIG. 1B is a plan view in which a trench hole group and trench groove are formed before forming an SON structure, and FIG. 1C is a plan view of the main portion after forming the SON structure;

FIGS. 2A to 2C are a pressure sensor manufacturing method, which is another embodiment of the invention, wherein FIGS. 2A to 2C are main portion manufacturing step diagrams shown in step order;

FIGS. 3A to 3C are configuration diagrams of a pressure sensor, which is another embodiment of the invention, wherein FIG. 3A is a sectional view of a main portion of the completed article, FIG. 3B is a plan view in which first and second trench hole groups are formed before forming SON structures, and FIG. 3C is a plan view of the main portion after forming the SON structures;

FIGS. 4A to 4C are a pressure sensor manufacturing method, wherein FIGS. 4A to 4C are main portion manufacturing step diagrams shown in step order;

FIGS. 8A to 8C are a pressure sensor 500 using an SON structure, wherein FIG. 8A is a sectional view of a main portion of the completed article, FIG. 8B is a plan view of the main portion before forming the SON structure, and FIG. 8C is a plan view of the main portion after forming the SON structure;

FIGS. 9A to 9C are a manufacturing method of the pressure sensor of FIGS. 8A to 8C, wherein FIGS. 9A to 9C are main portion manufacturing step diagrams shown in step order;

FIG. 10 is a diagram showing tensile stress distribution on a chip surface; and

DETAILED DESCRIPTION

Figure 8A:
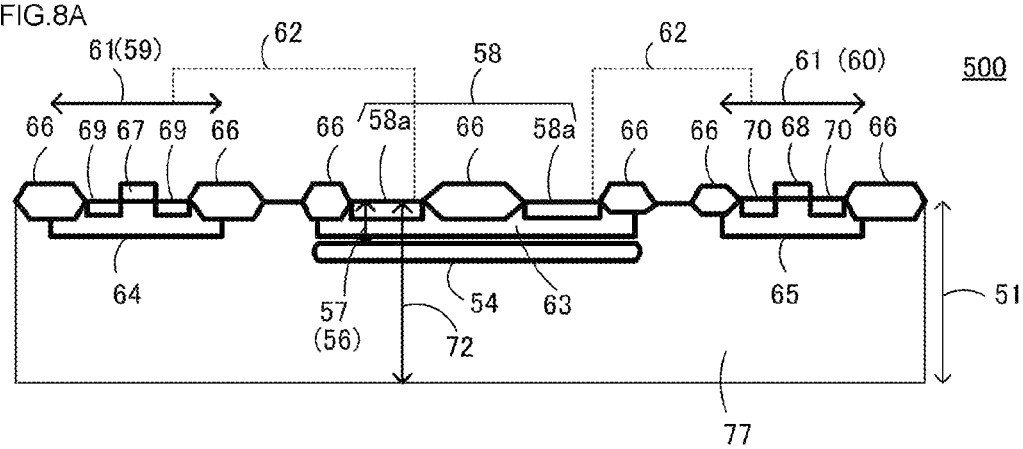
Figure 8B:
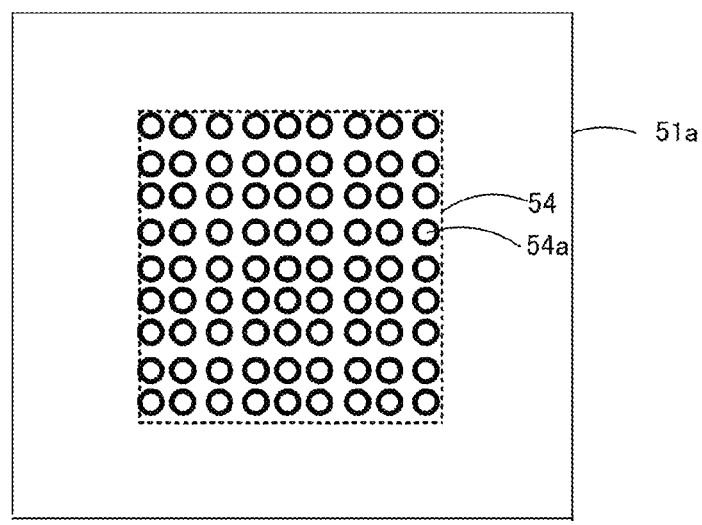
Figure 8C:
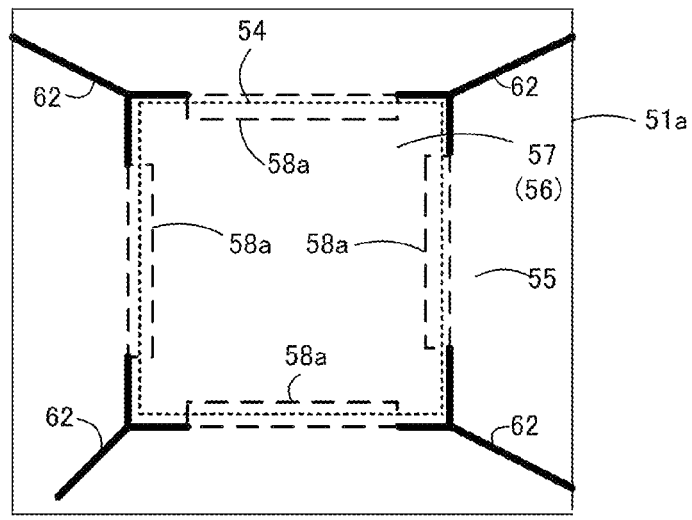

FIGS. 8A to 8C are a pressure sensor 500 using an SON structure, wherein FIG. 8A is a sectional view of a main portion of the completed article, FIG. 8B is a plan view of the main portion before forming the SON structure, and FIG. 8C is a plan view of the main portion after forming the SON structure. In FIG. 8A, no support substrate is shown.

Figure 7:
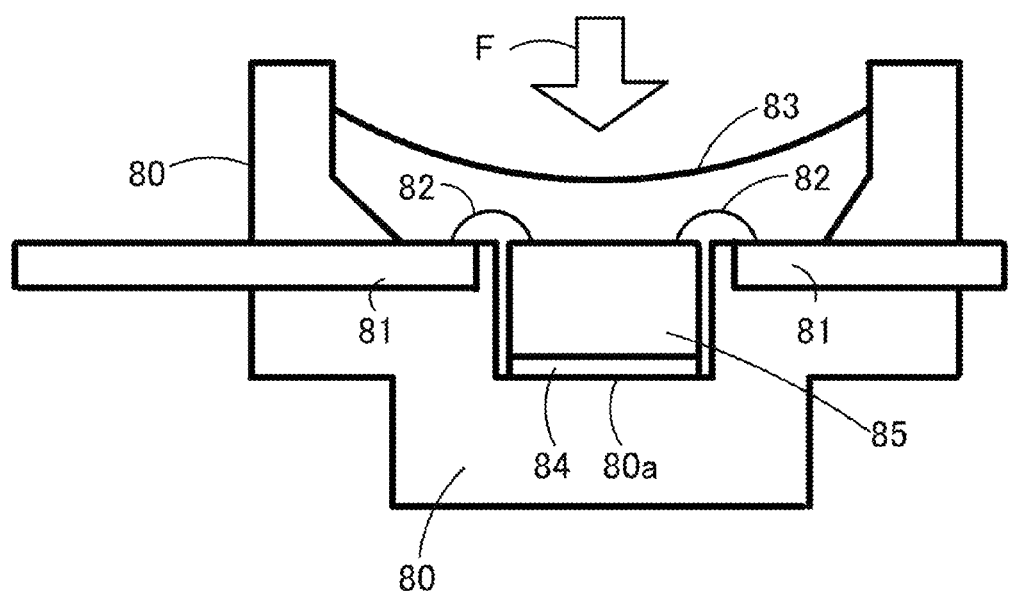
FIG. 7 is an overall view of a heretofore known pressure sensor 600.

The pressure sensor 500 includes a cavity 54, which is to form a reference pressure chamber, formed in a surface layer of a semiconductor substrate 51, a p⁻ semiconductor layer 56, which is to form a diaphragm 57, above the cavity 54, and a Wheatstone bridge 58 (configured of p⁻ layer gauge resistors 58a) formed in the diaphragm 57. The pressure sensor 500 includes an electronic circuit 61 disposed in an outer peripheral portion of the diaphragm 57, and a wire 62 that connects the Wheatstone bridge 58 and electronic circuit 61. Also, although not shown in FIGS. 8A to 8C, the pressure sensor 500 includes a package 80, an external lead-out terminal 81, a bonding wire 82, and gel 83, shown in FIG. 7.

An SON structure 72 shown in FIGS. 8A to 8C is configured of the semiconductor layer 56 above the cavity 54, the cavity 54, and the semiconductor substrate 51 below the cavity 54.

Of the reference numerals and signs in FIGS. 8A to 8C, 63 is an n-well region in which the gauge resistor 58a, which is a p⁻ layer, is formed, 64 is an n-well region in which a p-channel MOSFET 59, which configures the electronic circuit 61, is formed, 65 is a p-well region in which an n-channel MOSFET 60 is formed, 66 is a LOCOS structure, 67 and 68 are gate electrodes, 69 is a p$^+$ region that forms a source region and a drain region, and 70 is an n$^+$ region that forms a source region and a drain region, and the semiconductor layer 56 is a layer that also includes an epitaxial layer of the same conductivity type (p type) formed above an unshown thin semiconductor layer formed above the cavity 54.

Figure 9A:
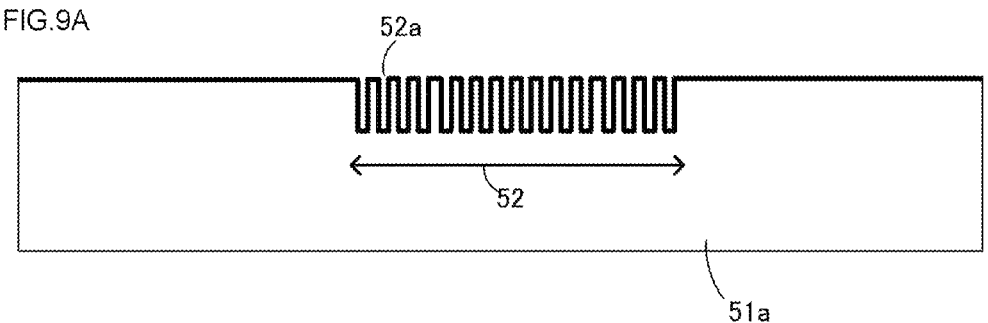
Figure 9B:
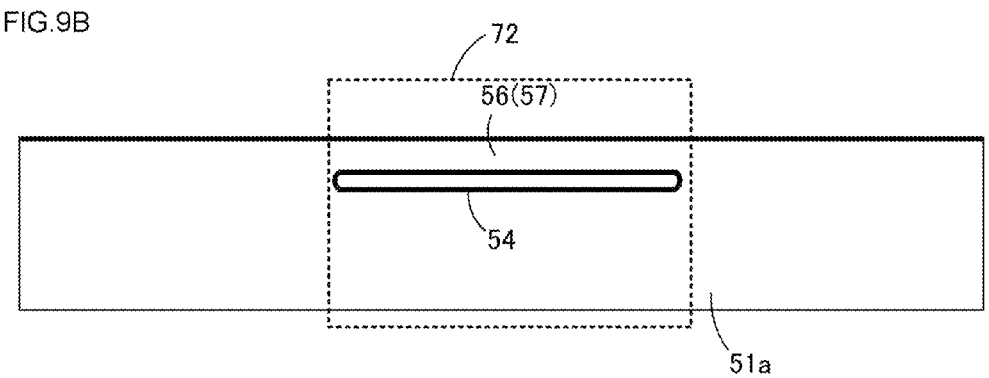
Figure 9C:
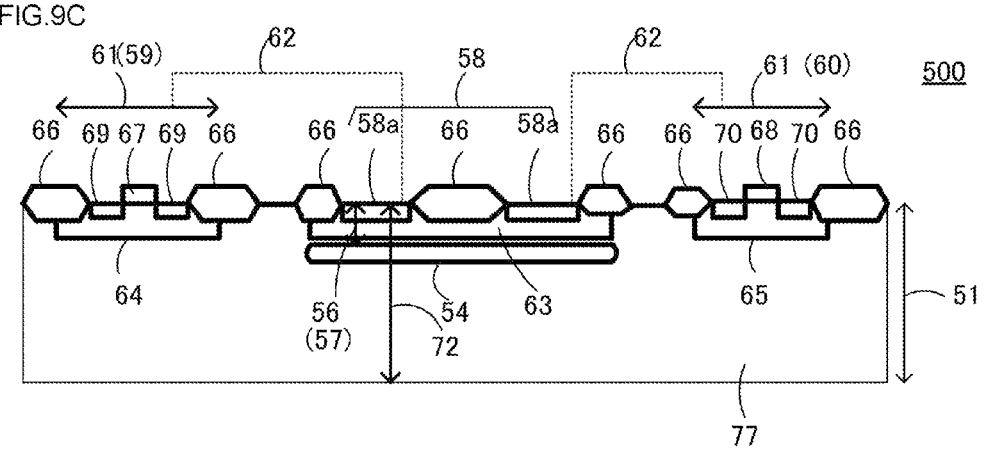

FIGS. 9A to 9C are a manufacturing method of the pressure sensor of FIGS. 8A to 8C, wherein FIGS. 9A to 9C are main portion manufacturing step diagrams shown in step order.

Firstly, in FIG. 9A, trench holes 52a of a trench hole group 52 are formed in a p$^-$ semiconductor wafer 51a.

Next, in FIG. 9B, the trench holes 52a of the trench hole group 52 deform owing to a hydrogen annealing being performed, and the cavity 54 is formed in the semiconductor wafer 51a, thereby completing the SON structure 72. The semiconductor layer 56 above the cavity 54 is to form the diaphragm 57.

Next, in FIG. 9C, the gauge resistor 58a of the Wheatstone bridge 58 is formed as a p$^-$ layer in the diaphragm 57, and the electronic circuit 61 configured of, for example, MOS transistors (for example, the p-channel MOSFET 59 and n-channel MOSFET 60) is formed in an IC manufacturing step on portions of the semiconductor wafer 51 other than above the cavity 54. Also, the Wheatstone bridge 58 and electronic circuit 61 are connected by the wire 62. Continuing, the semiconductor wafer 51 is cut to form a semiconductor chip 77, and the semiconductor chip 77 is fixed to the package 80 shown in FIG. 7, thereby completing the pressure sensor 500. FIG. 9C shows only lateral type MOS transistors configuring the electronic circuit 61.

By disposing the diaphragm 57 above the cavity 54, with the cavity 54 as a reference pressure chamber, in the pressure sensor 500 of FIGS. 8A to 8C, deformation of the diaphragm 57 occurs in accordance with pressure (pressure from a gas or liquid) applied to the semiconductor chip 77.

Because of this deformation, mechanical stress is generated in the diaphragm 57. The resistance value of the gauge resistor 58a of the Wheatstone bridge 58 disposed in the diaphragm 57 fluctuates in accordance with the mechanical stress (a piezoresistive effect).

The change in resistance is converted to an electrical signal by the gauge resistor 58a configuring the Wheatstone bridge 58.

This electrical signal, after amplification and trimming of characteristics by a signal amplifier or conditioning circuit, which is the electronic circuit 61 configured by MOS transistors or the like, is output to the exterior as the pressure sensor output.

In the pressure sensor 500 of FIGS. 8A to 8C, however, a difference in linear expansion coefficient occurs between the package 80 (for example, a resin such as polyphenylene sulfide (PPS) or polybutylene terephthalate (PBT), a ceramic, or phosphor bronze) and the semiconductor chip 77 (silicon) when fixing the semiconductor chip 77 to the package 80 with an adhesive 84. Because of this, mechanical stress is generated between the semiconductor chip 77 and package 80, with the temperature when attaching the semiconductor chip 77 as a reference.

Specifically, in an environment wherein the temperature is lower than the temperature when attaching the semiconductor chip 77, the thermal expansion coefficient of the package 80 is larger than that of the semiconductor chip 77, meaning that the package 80 shrinks more than the semiconductor chip 77. Because of this, compressive stress is generated on the rear surface of the chip 65, while tensile stress is generated on the surface of the semiconductor chip 77.

FIG. 10 is a diagram showing tensile stress distribution on a semiconductor chip surface 77a. In the pressure sensor 500 of FIGS. 8A to 8C, the tensile stress is of a form such that it reaches a maximum in a central portion of the semiconductor chip 77, as a result of which, stress is exerted on the sensor portion (the semiconductor chip 77) disposed in the central portion of the semiconductor chip 77, and this appears as an error of the pressure sensor 500. That is, mechanical stress generated by a factor other than measured pressure is a disturbance element, but the structure of the pressure sensor 500 of FIGS. 8A to 8C is such that this disturbance element is detected as an error signal.

Figure 11:
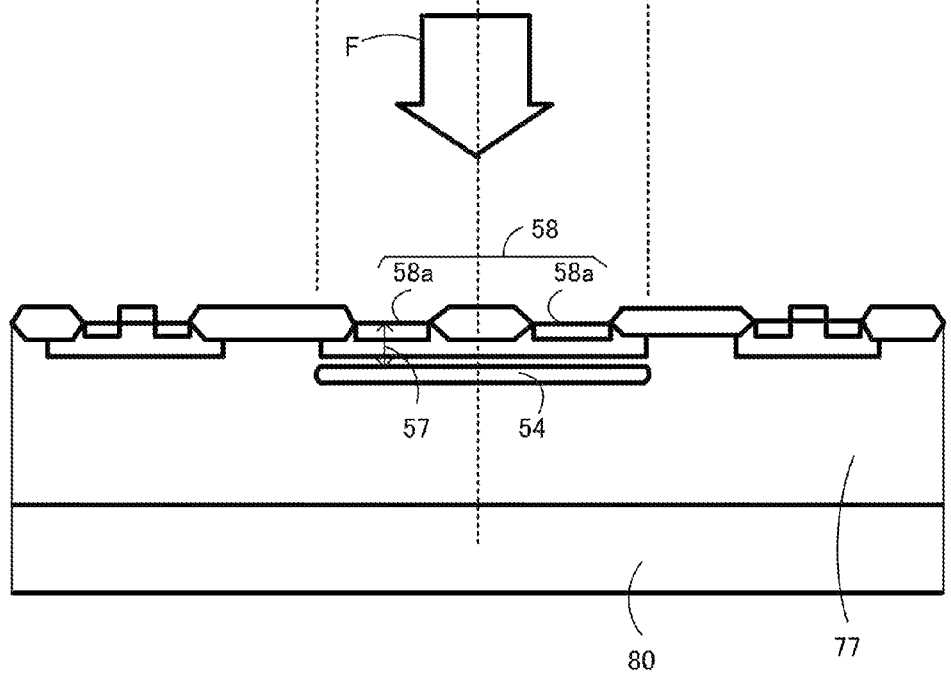
FIG. 11 is a diagram showing chip surface stress distribution when the diaphragm is subjected to the measured pressure F by a gas or fluid.

FIG. 11 is a diagram showing chip surface stress distribution when the diaphragm is subjected to a measured pressure F by a gas or fluid. As can be seen from FIG. 11, the tensile stress caused by the measured pressure F reaches a maximum at end portions of the cavity 54, while the tensile strength gradually decreases on the outer sides of the cavity 54. Because of this, the measured pressure F has an effect over a wide region in the periphery of the diaphragm 57. Because of this, it is necessary to distance the region in which the electronic circuit 61 is formed from the diaphragm 57. This means that the chip size increases.

The point of the invention is in providing a highly accurate pressure sensor by providing a stress relaxation region in the periphery of the diaphragm, thereby removing the disturbance factor of pressure to which the diaphragm is subjected from the outer periphery, and reducing the effect of the measured pressure on the electronic circuit in the outer periphery of the diaphragm. Embodiments will be described hereafter.

First Embodiment

Figure 1A:
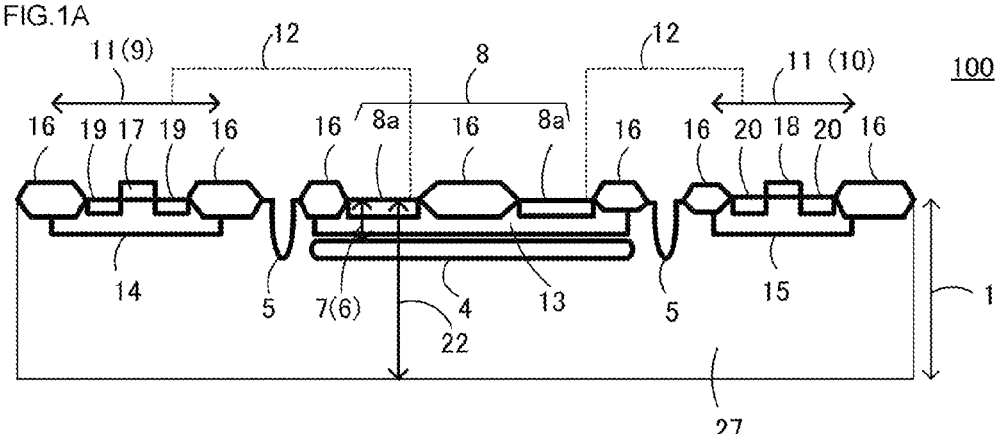
Figure 1B:
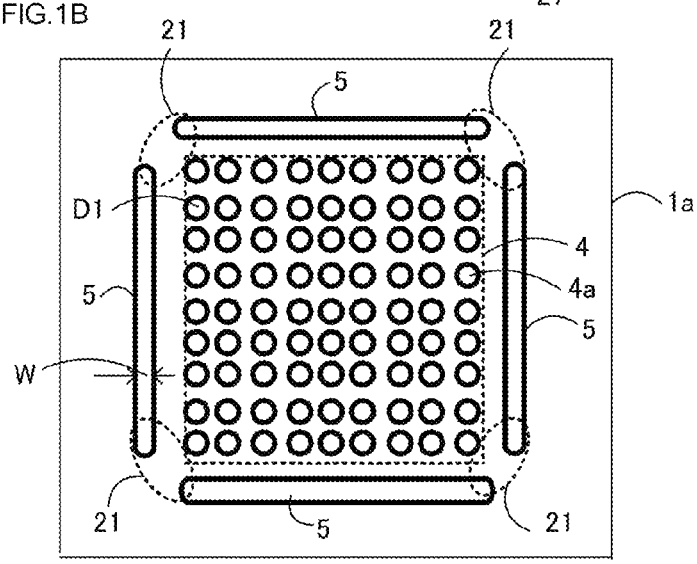
Figure 1C:
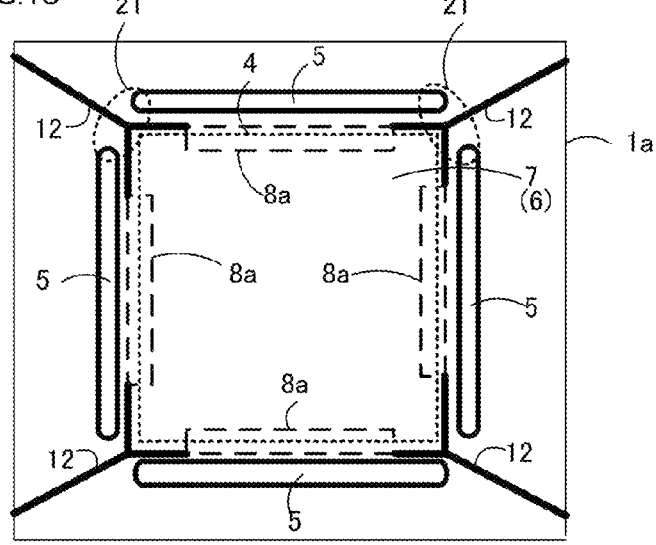

FIGS. 1A to 1C are configuration diagrams of a pressure sensor 100, which is a first embodiment of the invention, wherein FIG. 1A is a sectional view of a main portion of the completed article, FIG. 1B is a plan view in which a trench hole group and trench groove are formed before forming an SON structure 22, and FIG. 1C is a plan view of the main portion after forming the SON structure. FIG. 1A corresponds to FIG. 2C, FIG. 1B corresponds to FIG. 2A, and FIG. 1C corresponds to FIG. 2B.

The pressure sensor 100 includes a cavity 4, which is to form a reference pressure chamber, formed in a surface layer of a semiconductor substrate 1, a diaphragm 7 formed from a p$^-$ semiconductor layer 6 above the cavity 4, and a Wheatstone bridge 8 (configured of p$^-$ layer gauge resistors 8a) formed in the diaphragm 7. The pressure sensor 100 includes a trench groove 5, which is a stress relaxation region, disposed in an outer peripheral portion of the diaphragm 7, an electronic circuit 11 disposed in an outer peripheral portion of the trench groove 5, and a wire 12 that connects the Wheatstone bridge 8 and electronic circuit 11. Also, although not shown in FIGS. 1A to 1C, the pressure sensor 100 includes the package 80, the external lead-out terminal 81, the bonding wire 82, and the gel 83, shown in FIG. 7.

The plan form of the trench groove 5 is a ring-like form cut in four places, the trench groove 5 is disposed so as encircle the diaphragm 7, and the wire 12 is formed on the cut places 21. Herein, an example of the trench groove 5 being cut in four places is shown but, as it is sufficient that there are one or more cut places, there are also cases wherein the trench groove 5 is cut in one place, and the wire 12 is disposed concentrated in that place. The reason for forming the wire 12 in the place 21 (flat surface) where the trench groove 5 is cut in this way is to prevent imbalance occurring in the pattern of a resist for forming the wire 12, it not being possible to carry out application and exposure well due to the effect of the step of the trench groove 5, and to prevent the thickness of the wire 12 being locally reduced in a step portion. Also, the Wheatstone bridge 8 is configured of four gauge resistors 8a.

Figure 2A:
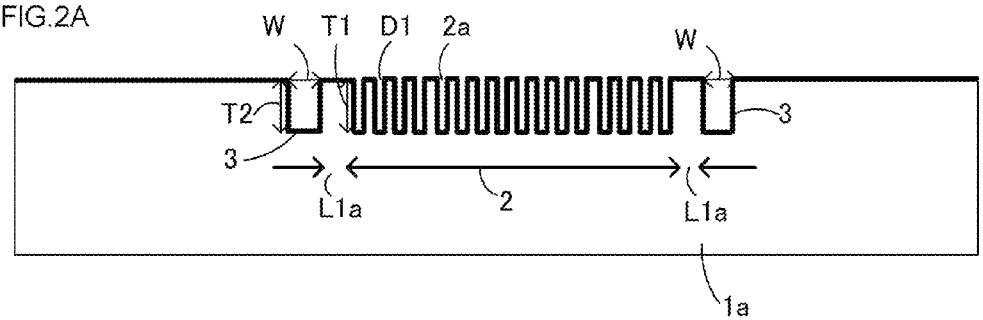
Figure 2B:
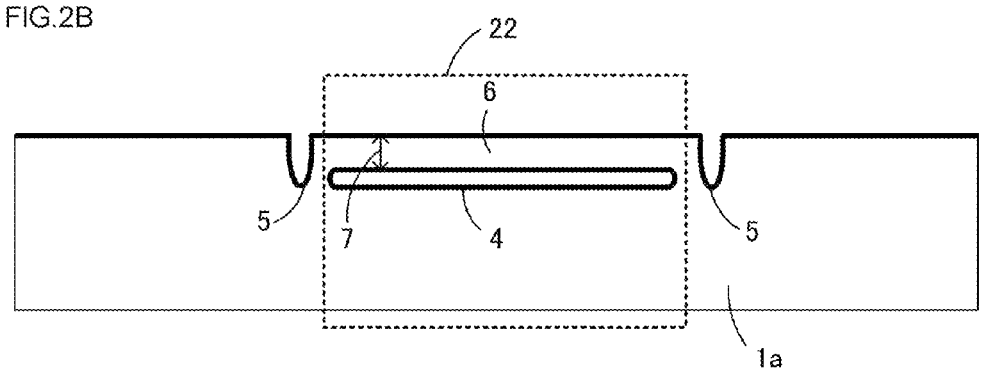

The SON structure 22 is configured of the semiconductor layer 6 above the cavity 4, the cavity 4, and the semiconductor substrate 1 below the cavity 4, as shown in FIG. 2B. Also, of the electronic circuit 11, only a p-channel MOSFET 9 and n-channel MOSFET 10, which are components of the electronic circuit 11, are shown herein.

Of the reference numerals and signs in FIGS. 1A to 1C, 13 is an n-well region, 14 is an n-well region in which the p-channel MOSFET 9, which configures the electronic circuit 11, is formed, 15 is a p-well region in which the n-channel MOSFET 10 is formed, 16 is a LOCOS structure, 17 and 18 are gate electrodes, 19 is a p$^+$ region that forms a source region and a drain region, and 20 is an n$^+$ region that forms a source region and a drain region, and the semiconductor layer 6 is a layer that includes a thin semiconductor layer (of a thickness in the region of, for example, 1 µm) formed above the cavity 4 when forming the SON structure using an annealing process, to be described hereafter, and an epitaxial layer (of a thickness in the region of, for example, 5µm to 15 µm) of the same conductivity type (p type) formed above the thin semiconductor layer. There are also cases wherein only the thin semiconductor layer is utilized for the semiconductor layer 6, without forming the epitaxial layer.

Figure 5:
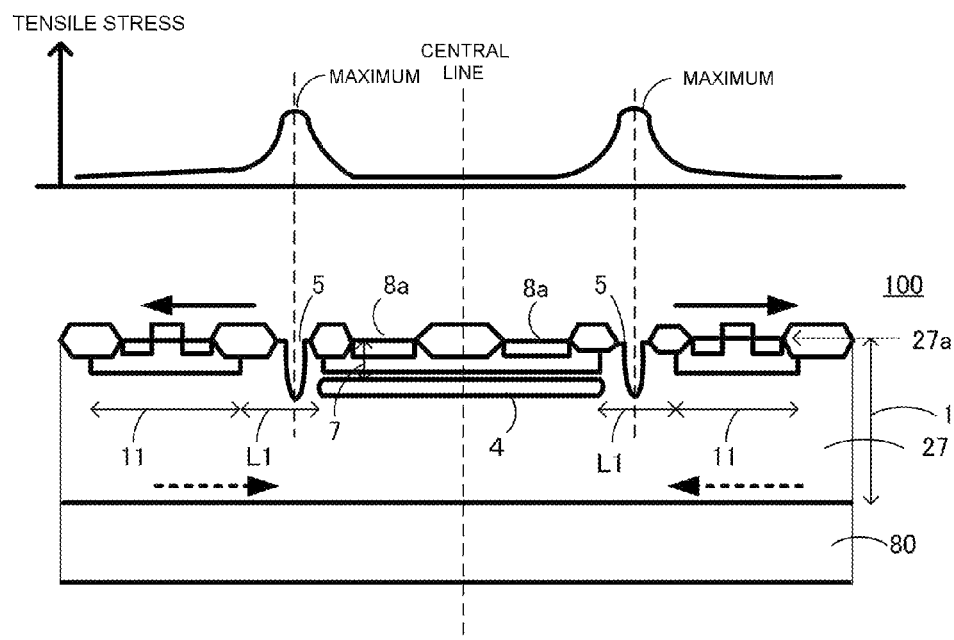
FIG. 5 is a diagram showing the distribution of tensile stress generated in a surface 27a of a semiconductor chip 27 of the pressure sensor 100 after assembly.

FIG. 5 is a diagram showing the distribution of tensile stress generated in a surface 27a of a semiconductor chip 27 of the pressure sensor 100 after assembly. The diagram shows the in-plane distribution of mechanical stress generated between the semiconductor chip 27 and package 80 when returning to a room temperature state after attaching the semiconductor chip 27 to the package 80 at a high temperature of 100 to 150° C.

Stress has a tendency to concentrate in a place with low rigidity (the cavity 4, or the like) or a place in which there is a step. Because of this, by providing the step formed by the trench groove 5 in the periphery of the diaphragm 7, the stress that reaches a maximum in the diaphragm 7 with the structure of FIGS. 8A to 8C is changed so as to reach a maximum in the position of the trench groove 5. As a result of this, it is possible to considerably reduce the stress generated on the diaphragm 7.

As heretofore described, it is possible to relax the effect (disturbance) of pressure to which the diaphragm 7 is subjected from the periphery by disposing the trench groove 5, which is a stress relaxation region, in the periphery of the diaphragm 7. As a result of this, it is possible to fabricate a highly accurate pressure sensor 100.

That is, by providing the trench groove 5, the effect on the diaphragm 7 of stress (in particular, tensile stress in the surface layer of the semiconductor substrate 1 in which the gauge resistor 8a is formed) caused by the difference in linear expansion coefficient with the package 80 is reduced, pressure other than the measured pressure F, which is a disturbance element, is reduced, and it is possible to improve the accuracy of the pressure sensor 100.

Figure 6:
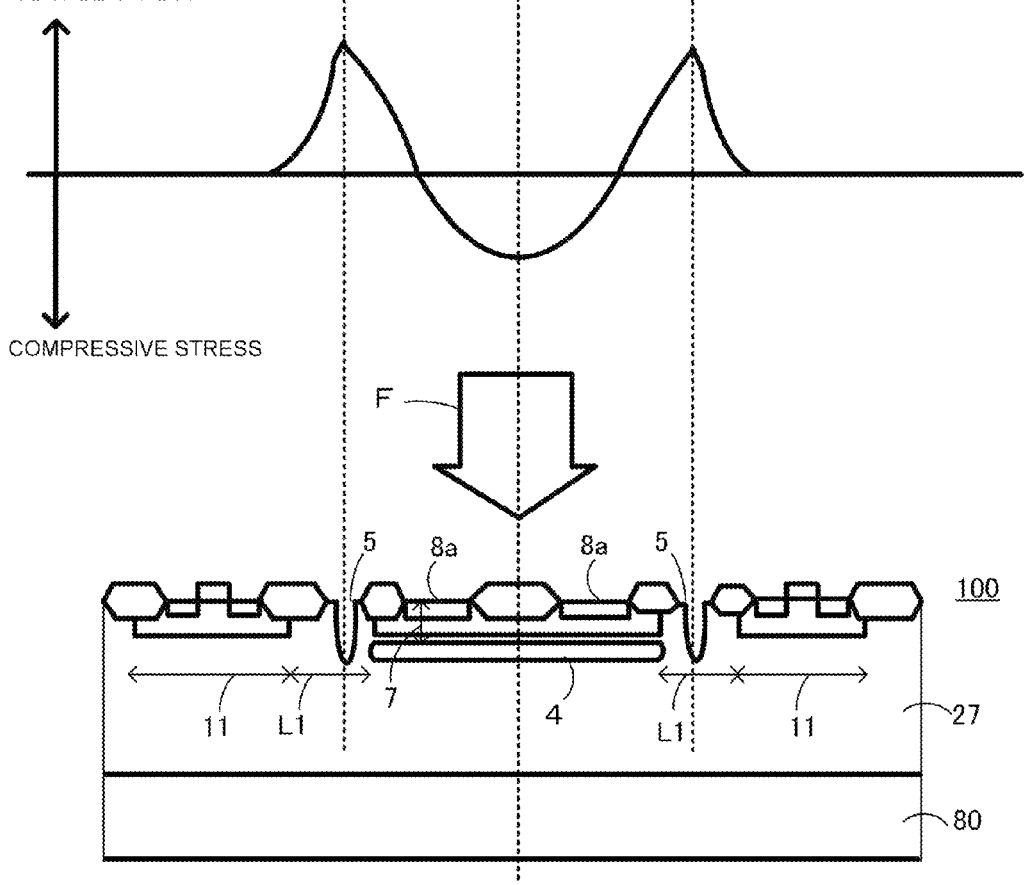
FIG. 6 is a diagram showing stress distribution when a diaphragm 7 is subjected to a measured pressure F.

FIG. 6 is a diagram showing stress distribution when the diaphragm 7 is subjected to the measured pressure F. The measured pressure F is such that, the trench groove 5 forming a barrier, the mechanical stress transmitted to the electronic circuit 11 is reduced. As a result of this, it is possible to improve the accuracy of the pressure sensor 100.

By providing the trench groove 5 in the way heretofore described, it is possible to reduce the effect of the pressure to which the diaphragm 7 is subjected from the outer periphery and the effect of the pressure to which the electronic circuit 11 is subjected from the diaphragm, as heretofore described, meaning that it is possible to reduce a distance L1 between the electronic circuit 11 and diaphragm 7 in comparison with that in the structure of FIGS. 8A to 8C, and thus possible to reduce the chip size.

Second Embodiment

Figure 2C:
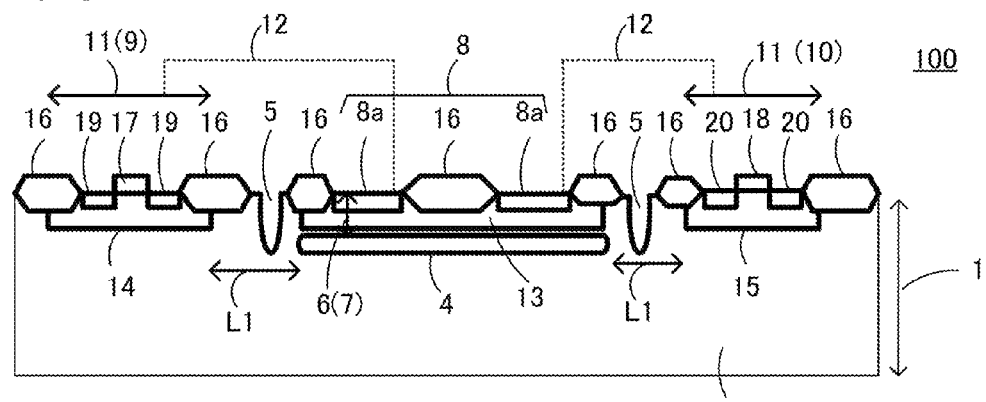

FIGS. 2A to 2C are a pressure sensor 100 manufacturing method, which is a second embodiment of the invention, wherein FIGS. 2A to 2C are main portion manufacturing step diagrams shown in step order.

Firstly, in FIG. 2A, a trench hole group 2 and a trench groove 3 distanced from the trench hole group 2 are formed simultaneously in a p$^-$ semiconductor wafer 1a. A width W of an aperture portion of the trench groove 3 is made larger than a diameter D1 (in the region of, for example, 0.5 µm) of an aperture portion of a trench hole 2a of the trench hole group 2 so that no cavity is formed by an annealing process, such as a hydrogen annealing, in the next step. Also, it is preferable that a depth T2 of the trench groove 3 is equal to or greater than a depth T1 of the trench hole 2a. It is possible to form the trench hole group 2 and trench groove 3 simultaneously. In the next step of forming the cavity 4, it is preferable in order to reduce the chip size that a distance L1a between the trench hole group 2 and trench groove 3 is made as small as possible within a range wherein the cavity 4 and trench groove 5 are not in contact.

Next, in FIG. 2B, the trench hole group 2 deforms owing to an annealing process such as a hydrogen annealing being performed, and the cavity 4 is formed in the semiconductor wafer 1a, thereby completing the SON structure 22. At this time, the trench groove 3 also deforms, but the aperture portion is not closed off, and the trench groove 3 forms the trench groove 5 without a cavity being formed. By a thin semiconductor layer being formed above the cavity 4, and an epitaxial layer being formed above the thin semiconductor layer, the semiconductor layer 6 is formed, and can be adopted as the diaphragm 7. It is also possible to adopt only the thin semiconductor layer above the cavity 4 formed by the annealing process as the diaphragm 7, without forming an epitaxial layer. Also, the trench groove 3 deforms, becoming the trench groove 5, and the trench groove 5 forms a stress relaxation region.

Next, in FIG. 2C, the gauge resistor 8a of the Wheatstone bridge 8 is formed as a p$^-$ layer in the diaphragm 7, and the electronic circuit 11 configured of, for example, MOS transistors (for example, the p-channel MOSFET 9 and n-channel MOSFET 10) is formed in an IC manufacturing step on portions of the semiconductor wafer 1 other than above the cavity 4. Also, the wire 12 (an Al wire or the like) connecting the Wheatstone bridge 8 and electronic circuit 11 is formed in a region in which the trench groove 5 is not formed. Continuing, the semiconductor wafer 1 is cut to form the semiconductor chip 27, and the rear surface of the semiconductor chip 27 is fixed with an adhesive, or the like, to the package 80 shown in FIG. 7, thereby completing the pressure sensor 100.

Third Embodiment

Figure 3A:
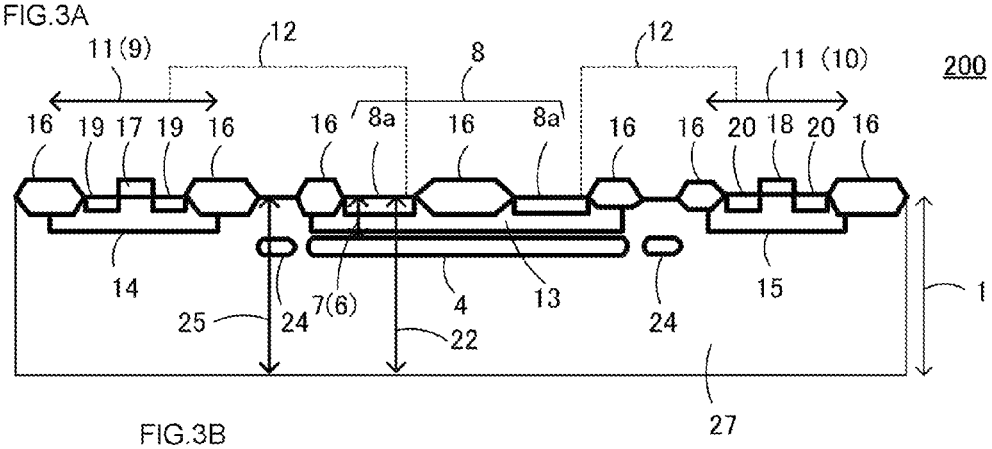
Figure 3B:
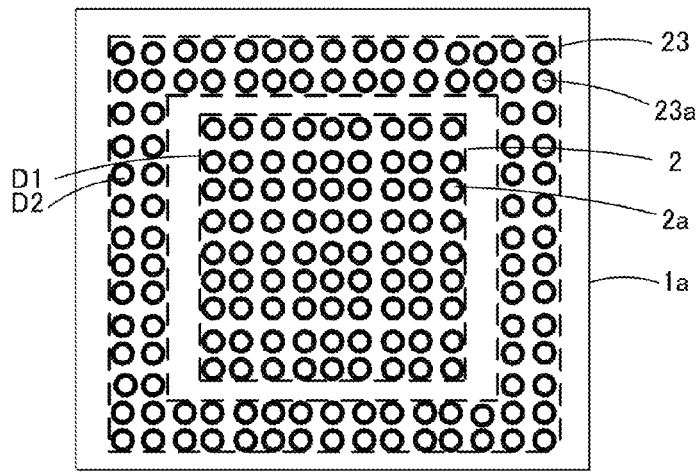
Figure 3C:
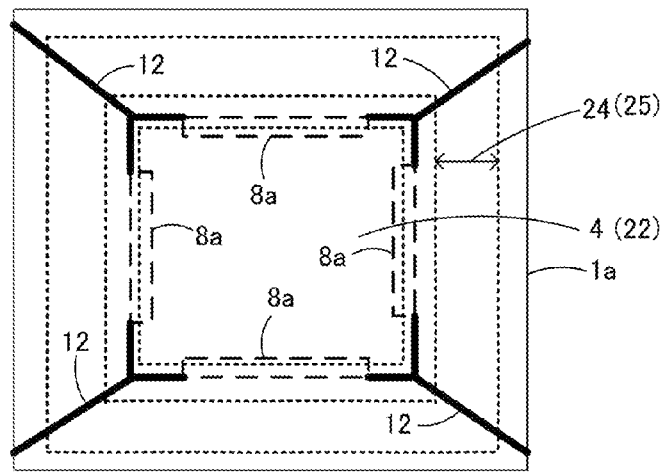

FIGS. 3A to 3C are configuration diagrams of a pressure sensor 200, which is a third embodiment of the invention, wherein FIG. 3A is a sectional view of a main portion of the completed article, FIG. 3B is a plan view in which first and second trench hole groups 2 and 23 are formed before forming SON structures 22 and 25, and FIG. 3C is a plan view of the main portion after forming the SON structures 22 and 25. FIG. 3A corresponds to FIG. 4C, FIG. 3B corresponds to FIG. 4A, and FIG. 3C corresponds to FIG. 4B.

The pressure sensor 200 includes the first cavity 4 (the same as the cavity 4 of FIGS. 1A to 1C), which is to form a reference pressure chamber, formed in a surface layer of the semiconductor substrate 1, a second cavity 24, which is to form a stress relaxation region, disposed distanced from the first cavity 4 in an outer peripheral portion of the first cavity 4, the diaphragm 7 formed from the semiconductor layer 6 above the first cavity 4, the electronic circuit 11 disposed in an outer peripheral portion of the second cavity 24, and the wire 12 that connects the Wheatstone bridge 8 and electronic circuit 11. Also, although not shown in FIGS. 3A to 3C, the pressure sensor 200 includes the package 80, the external lead-out terminal 81, the bonding wire 82, and the gel 83, shown in FIG. 7.

The plan form of the second cavity 24 is a ring that encircles the periphery of the first cavity 4. Of course, rather than a ring, it may also be a form having a place in which one portion is cut. The gauge resistors 8a configuring the Wheatstone bridge 8 are formed in the diaphragm 7. The region in which the first cavity 4 is formed being the same as in the SON structure 22 of FIGS. 1A to 1C, it is given the same reference numeral here, and called the first SON structure 22. Also, the region in which the second cavity 24 is formed is the second SON structure 25.

By disposing the second cavity 24 (a component of the second SON structure 25), which is a stress relaxation region, in the periphery of the diaphragm 7, it is possible to change the stress so as to reach a maximum in the second SON structure 25, which is a stress relaxation region, in the same way as in FIG. 5, and thus possible to reduce the stress to which the diaphragm 7 is subjected from the periphery. That is, by providing the second SON structure 25, the effect on the diaphragm 7 of stress caused by the difference in linear expansion coefficient is reduced, pressure other than the measured pressure F, which is a disturbance element, is reduced, and it is possible to improve the accuracy of the pressure sensor 200.

Also, the measured pressure F is such that, the second SON structure 25 forming a barrier, the mechanical stress transmitted to the electronic circuit 11 is reduced. As a result of this, it is possible to improve the accuracy of the pressure sensor 200.

By providing the second SON structure 25 in the way heretofore described, it is possible to reduce the effect of the pressure to which the diaphragm 7 is subjected from the outer periphery and the effect of the pressure to which the electronic circuit 11 is subjected from the diaphragm 7, as heretofore described, meaning that it is possible to reduce the distance between the electronic circuit 11 and diaphragm 7 in comparison with that in the structure of FIGS. 8A to 8C, and thus possible to reduce the chip size.

Fourth Embodiment

Figure 4A:
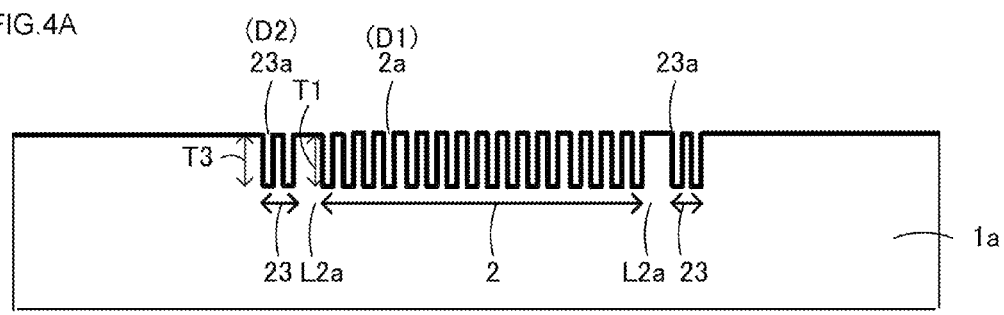
Figure 4B:
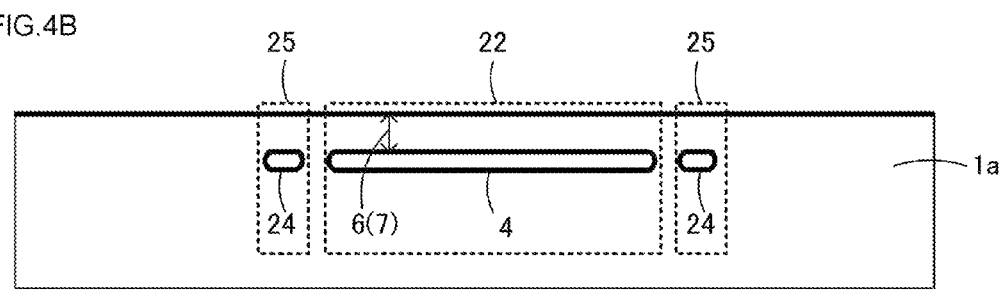
Figure 4C:
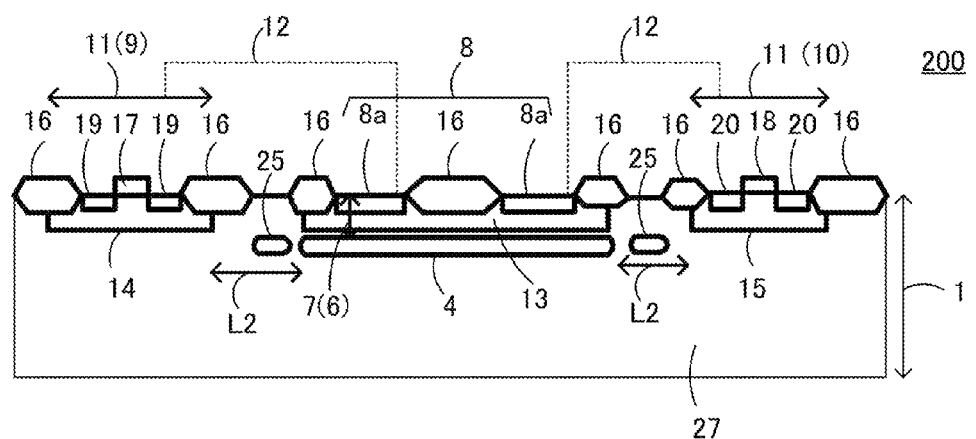

FIGS. 4A to 4C are a pressure sensor 200 manufacturing method, which is a fourth embodiment of the invention, wherein FIGS. 4A to 4C are main portion manufacturing step diagrams shown in step order.

Firstly, in FIG. 4A, the first trench hole group 2 and, distanced from the first trench hole group 2, a ring-like second trench hole group 23 encircling the periphery of the first trench hole group 2 are formed simultaneously in the p⁻ semiconductor wafer 1a. An aperture portion diameter D2 and depth T3 of a second trench hole 23a configuring the second trench hole group 23 are the same as the aperture portion diameter D1 (in the region of, for example, 0.5 µm) and depth T1 (in the region of, for example, 7 µm to 10 µm) of the first trench hole 2a configuring the first trench hole group 2. Also, a distance L2a between the first trench hole group 2 and second trench hole group 23 is set to a distance (in the region of, for example, a few micrometers) such that the cavities 4 and 24 are not joined together by a subsequently performed hydrogen annealing.

Next, in FIG. 4B, the first and second trench hole groups 2 and 23 deform owing to an annealing process such as a hydrogen annealing being performed, and the first and second cavities 4 and 24 are formed in the semiconductor substrate, thereby completing the first and second SON structures 22 and 25. The semiconductor layer 6 above the first cavity 4 forms the diaphragm 7, and the second SON structure 25 forms a stress relaxation region. It is often the case, however, that the semiconductor layer 6 is configured of a thin semiconductor layer and an epitaxial layer formed above the thin semiconductor layer.

Next, in FIG. 4C, the gauge resistor 8a of the Wheatstone bridge 8 is formed as a p⁻ layer in the diaphragm 7, and the electronic circuit 11 configured of, for example, MOS transistors (for example, the p-channel MOSFET 9 and n-channel MOSFET 10) is formed in an IC manufacturing step on portions of the semiconductor wafer 1 other than above the cavity 4. Also, the wire 12 connecting the Wheatstone bridge 8 and electronic circuit 11 is formed. Continuing, the semiconductor wafer 1 is cut to form the semiconductor chip 27, and the semiconductor chip 27 is fixed with an adhesive to the package 80 shown in FIG. 7, thereby completing the pressure sensor 200.

As the surface of a place in which an SON structure is formed is flatter than the trench groove 5, resist application and removal in the IC manufacturing step for forming the electronic circuit 11, and the disposition of the wire 12 (an Al wire or the like), are extremely easy. Also, freedom of design with regard to the wire 12 (width, thickness, and disposition) is extremely high in comparison with the case of the trench groove 5.

In the first to fourth embodiments, a description has been given using an example of the pressure sensors 100 and 200 as physical quantity sensors but, not being limited to this, the invention can also be applied to an acceleration sensor, or the like.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

This application is based on, and claims priority to, Japanese Patent Application No. 2012-015141, filed on Jan. 27, 2012. The disclosure of the priority application, in its entirety, including the drawings, claims, and the specification thereof, is incorporated herein by reference.

What is claimed is:

1. A physical quantity sensor with a SON structure, comprising:
   a cavity, disposed in a surface layer of a semiconductor substrate and forming a reference pressure chamber, that configures a silicon-on-nothing (SON) structure;
   a diaphragm, formed from a semiconductor layer, that configures the SON structure above the cavity;

a stress relaxation region of the semiconductor substrate disposed distanced from the diaphragm in an outer peripheral portion of the diaphragm;

a Wheatstone bridge disposed in the diaphragm;

an electronic circuit disposed in an outer peripheral portion of the stress relaxation region; and a connecting wire that connects the Wheatstone bridge and electronic circuit.

2. The physical quantity sensor with a SON structure according to claim 1, wherein, the stress relaxation region is a trench groove, the plan form of the trench groove is a ring with a place in which one portion is cut, and the connecting wire that connects the Wheatstone bridge and electronic circuit is disposed on the place in which one portion is cut.

3. The physical quantity sensor with a SON structure according to claim 1, wherein, the stress relaxation region, with the SON structure as a first SON structure, is a second SON structure disposed in an outer peripheral portion of the first SON structure.

4. The physical quantity sensor with a SON structure according to claim 3, wherein, the plan form of the second SON structure is a ring or a ring with a place in which one portion is cut.

5. The physical quantity sensor with a SON structure according to claim 1, wherein, the physical quantity sensor is a pressure sensor or an acceleration sensor.

* * * * *